United States Patent [19]

Girard

[11] Patent Number: 5,573,382

[45] Date of Patent: Nov. 12, 1996

[54] MULTI-SPEED ELECTRIC FAN

[76] Inventor: Furness W. Girard, 41 Davenport St., Waggaman, La. 70094

[21] Appl. No.: 376,782

[22] Filed: Jan. 23, 1995

[51] Int. Cl.⁶ .................................................. F04B 17/00
[52] U.S. Cl. ................. 417/326; 416/247 R; 200/52 R
[58] Field of Search .................. 417/326; 416/247 R; 200/52 R, 600

[56] References Cited

U.S. PATENT DOCUMENTS

| | | | |
|---|---|---|---|
| 3,922,563 | 11/1975 | Penman | 200/600 |
| 4,045,629 | 8/1977 | Anzani | 200/600 |
| 4,211,959 | 7/1980 | Deavenport et al. | 200/600 |
| 4,264,798 | 4/1981 | Graf | 200/181 |
| 4,486,811 | 12/1984 | Kamiya et al. | 361/280 |
| 4,668,876 | 5/1987 | Skarman | 200/600 |
| 4,668,877 | 5/1987 | Kunen | 200/600 |
| 4,672,229 | 6/1987 | Skarman et al. | 200/600 |
| 4,785,198 | 11/1988 | Chin-Hsiang | 307/154 |
| 5,167,090 | 12/1992 | Cody | 43/139 |
| 5,293,103 | 3/1994 | Hanna | 318/268 |

FOREIGN PATENT DOCUMENTS

| | | | |
|---|---|---|---|
| 63-16195 | 1/1988 | Japan | 416/247 R |
| 3-252017 | 11/1991 | Japan | 200/52 R |

Primary Examiner—Timothy S. Thorpe
Assistant Examiner—Xuan M. Thai
Attorney, Agent, or Firm—Joseph N. Breaux

[57] ABSTRACT

A multi-speed electric fan comprising a fan assembly, a variable power controller and an electrostatically actuated signal generator. The fan assembly includes an electric fan motor having a pair of power supply inputs. The variable power controller has a pair of power inputs, a pair of power outputs, and an actuating signal input. The actuating signal controls the power output of the variable power controller. The signal generator preferably includes a conducting plate, having an insulated conducting lead, and an isolation housing, having an open top. The conducting plate is installed within the isolation housing in a manner such that the conducting plate is electrically isolated from the housing of the fan assembly and the conducting lead is in electrical connection with the signal generator. The isolation housing preferably includes an aperture through a section thereof of a size sufficient to allow the insulated conducting lead to pass therethrough and includes a recessed, conducting plate receiving notch located adjacent a peripheral lip of the isolation housing. The conducting plate is preferably a substantially rectangular shaped metal plate having rounded corners.

1 Claim, 2 Drawing Sheets

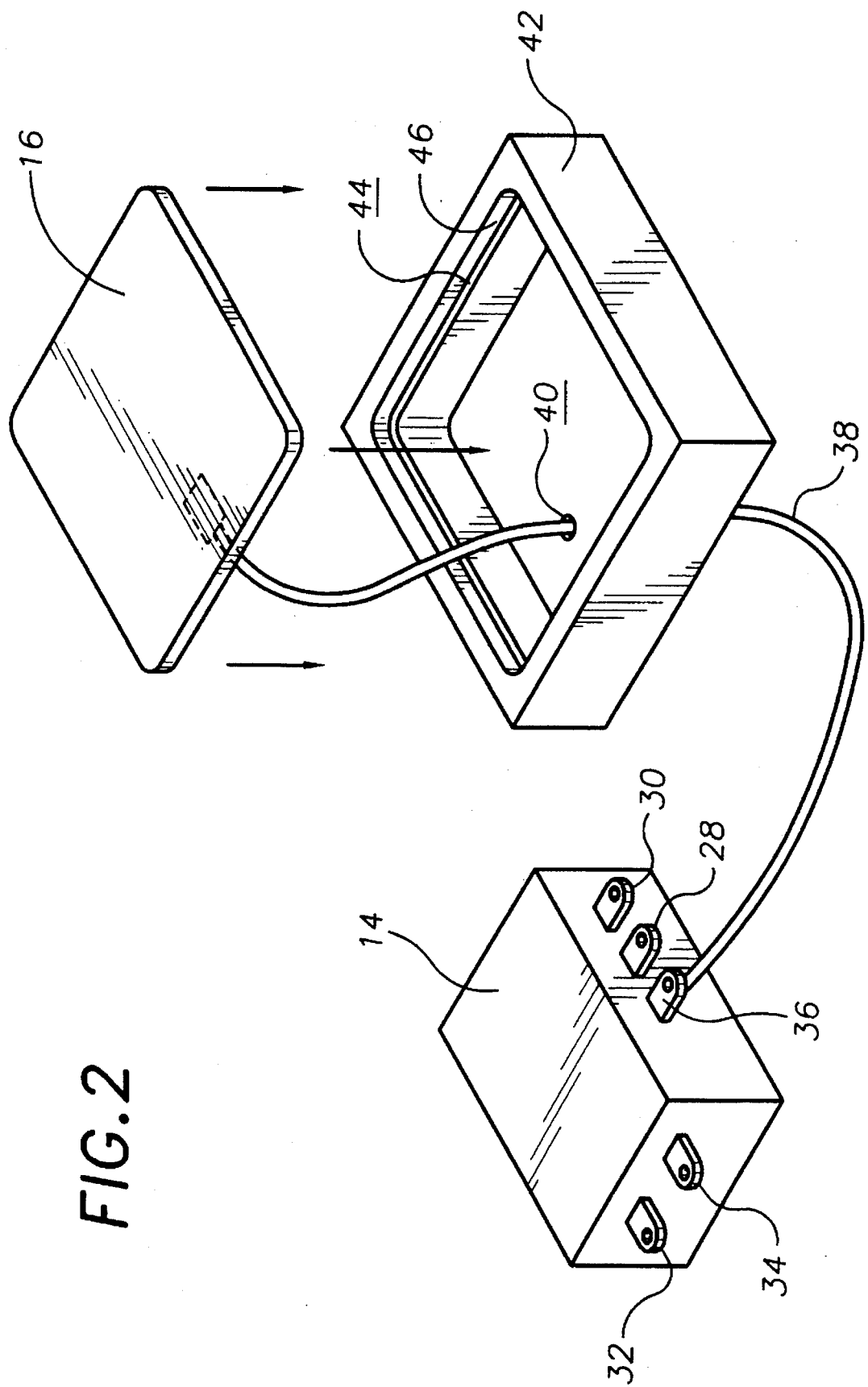

5,573,382

MULTI-SPEED ELECTRIC FAN

TECHNICAL FIELD

The present invention relates to devices for circulating air within a room and, more particularly, to devices for circulating air within a room that have a multi-speed motor controller operable by individuals having hand and finger disabilities.

BACKGROUND ART

Simple, everyday tasks, which require the use hand and figure manipulations can be difficult or impossible individuals with arthritis and other hand and/or finger disabling ailments. One such task, and the problem to which this invention is directed, is manipulating the existing push button and rotating speed controls on conventional air circulation fans.

It would be a benefit to those persons who, because of arthritis or other ailments, are unable to grasp or exert force with their fingers and/or hands, to the extent they are unable adjust the speed of a fan having conventional control switches to a desired level, to have a multi-speed fan which could be adjusted without having to exert a force with the hands and/or fingers.

GENERAL SUMMARY DISCUSSION OF INVENTION

It is thus an object of the invention to provide a multi-speed electric fan that will allow individuals having no or poor hand control to regulate the fan speed without exerting a painful force with the hand and/or fingers.

It is a further object of the invention to provide a multi-speed electric fan that will step through a predetermined sequence of fan speeds in response to a series of low pressure contacts with the skin surface of a user.

It is a still further object of the invention to provide a multi-speed electric fan that will step through a predetermined sequence of fan seeds in response to a series of low pressure contacts with the skin surface of a user which has an isolated contact point to allow the fan direction to be changed without altering the speed of the fan.

It is a still further object of the invention to provide a multi-speed electric fan that accomplishes all or some of the above mentioned objectives.

Accordingly, a multi-speed electric fan is provided. The fan comprises a fan assembly, a variable power controller and an electrostatically actuated signal generator. The fan assembly includes an electric fan motor having a pair of power supply inputs. The variable power controller has a pair of power inputs, a pair of power outputs, and an actuating signal input. The actuating signal controls the power output of the variable power controller.

The variable power controller preferably supplies at least four predetermined power output levels to the fan motor, and more preferably supplies the power levels in a sequence from lowest to highest power level in response to the signal from the signal generating means.

The signal generator preferably includes a conducting plate, having an insulated conducting lead, and an isolation housing, having an open top. The conducting plate is installed within the isolation housing in a manner such that the conducting plate is electrically isolated from the housing of the fan assembly and the conducting lead is in electrical connection with the signal generator. The isolation housing preferably includes an aperture through a section thereof of a size sufficient to allow the insulated conducting lead to pass therethrough and includes a recessed, conducting plate receiving notch located adjacent a peripheral lip of the isolation housing. The conducting plate is preferably a substantially rectangular shaped metal plate having rounded corners.

BRIEF DESCRIPTION OF DRAWINGS

For a further understanding of the nature and objects of the present invention, reference should be had to the following detailed description, taken in conjunction with the accompanying drawings, in which like elements are given the same or analogous reference numbers and wherein:

FIG. 2 is a perspective view of the variable power controller and the isolation housing of the exemplary embodiment of FIG. 1.

EXEMPLARY MODE FOR CARRYING OUT THE INVENTION

Figure 1:
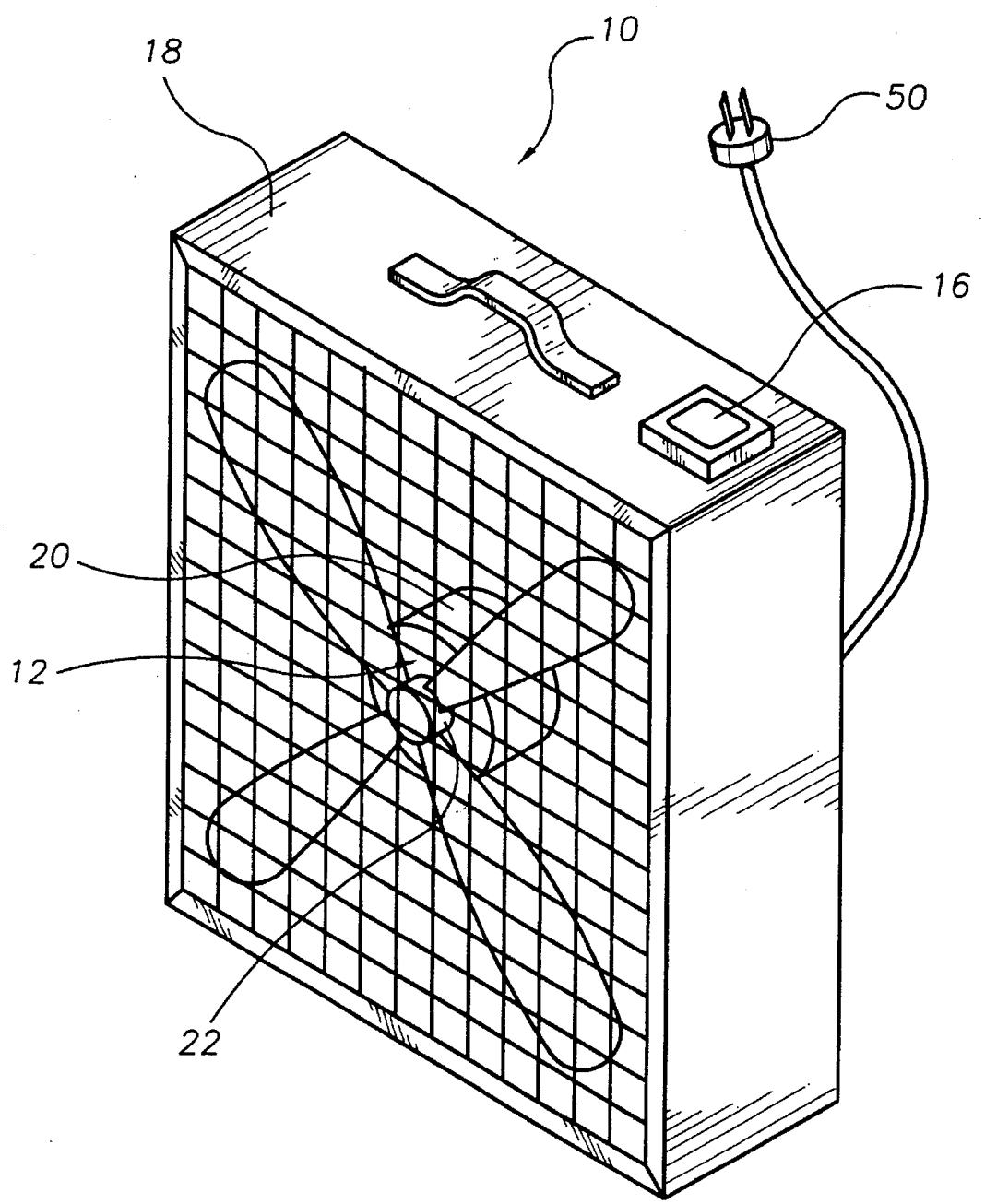
FIG. 1 is a perspective view of an exemplary embodiment of the multi-speed fan of the present invention.

FIG. 1 shows and exemplary embodiment of the multi-speed fan of the present invention generally designated by the numeral 10. Fan 10 includes a fan assembly 12, a variable power controller ( shown at 14 in FIG. 2) including an electrostatically actuated signal generating mechanism connected to a conducting plate 16.

Fan assembly 14 includes a rectangular metal housing 18, an electric fan motor 20 having a rotating element 22 and two electrical supply terminals, and four fan blades 24 attached to rotating element 22.

With reference to FIG. 2, a Citizen, model# TA-306, 0,⅓,⅔, full power, touch actuated, variable power controller 14 is shown. Power controller 14 includes two power input terminals 28,30, two power output terminals 32,34, and a signal generator input terminal 36. Power input terminal 28,30 are connected to a standard electrical power cord having a plug for insertion into a wall outlet. Power output terminals 32,34 are wired to the electrical supply terminals of electric motor 20. Signal generator input terminal 36 is wired to conducting plate 16 using an insulated conductor 38. Insulated conductor 38 passes through an aperture 40 formed through an isolation housing 42. Isolation housing is constructed from non-conducting plastic and includes a conducting plate receiving notch formed around the interior peripheral lip 46. Conducting plate 16 is inserted into receiving notch 44.

Operation of fan 10 is now described with reference to FIGS. 1 and 2. When power plug 50 (FIG. 1) is inserted into a power outlet the fan motor controller sets the power supply to zero power. Touching conducting plate 16 with a skin surface sequentially steps the power supply level up one level. If the power supply level is at full power, the power controller resets the power supply level to zero power on the next skin contact with conducting plate 16. By isolating conducting plate 16 within an isolation housing 42, the fan direction and location may be changed without effecting operation of fan 10.

It can be seen from the preceding description that a method and device for circulating air within a room which will allow individuals having no or poor hand control to easily regulate the fan speed, and which allows the fan to be positioned and repositioned without varying speed of the fan motor has been provided.

It is noted that the embodiment of the multi-speed electric fan described herein in detail for exemplary purposes is of course subject to many different variations in structure, design, application and methodology. Because many varying and different embodiments may be made within the scope of the inventive concept(s) herein taught, and because many modifications may be made in the embodiment herein detailed in accordance with the descriptive requirements of the law, it is to be understood that the details herein are to be interpreted as illustrative and not in a limiting sense.

What is claimed is:

1. An electric fan comprising:

an assembly including a blade housing, an electric fan motor mounted within said blade housing having a rotating element and at least two electrical supply inputs, and a plurality of fan blades in connection with said rotating element;

a variable power controller having a first power terminal, a second power terminal, and an input signal terminal; one of said first and second terminals being wired in series with one of said electrical supply inputs of said fan motor, said variable power controller being responsive to an input signal placed on said input signal terminal in a manner to vary the power supplied to said electric fan motor in response to said input signal; and an electrostatically actuated signal generating means, in electrical connection with said input signal terminal of said variable mower controller, for generating a signal to said variable power controller, said signal generating means including a conducting plate, having an insulated conducting lead, and an isolation housing, having an open top; said conducting plate being installed within said isolation housing in a manner such that said conducting plate is electrically isolated from said blade housing of said fan assembly, said conducting lead being in electrical connection with said signal generating means, said isolation housing including an aperture through a section thereof of a size sufficient to allow said insulated conducting lead to pass therethrough, said conducting plate being substantially rectangular shaped metal plate having rounded corners, said isolation housing including a recessed, conducting plate receiving notch located adjacent a peripheral lid section defining said open top; said receiving notch being dimensioned in a manner such that said conducting plate is secured within said isolation housing, said variable power controller supplying at least four predetermined power levels to said electric fan motor, said variable power controller stepping through said four predetermined power levels in a sequence from lowest to highest power level in response to said signal from said signal generating means.

\* \* \* \* \*